(12) United States Patent
Jarvis

(10) Patent No.: US 8,398,760 B2
(45) Date of Patent: Mar. 19, 2013

(54) ENERGY ACTIVATED COMPOSITIONS

(75) Inventor: Anthony Jarvis, Cheshire (GB)

(73) Assignee: Datalase Ltd., Cheshire (GB)

( * ) Notice: Subject to any disclaimer, the term of this patent is extended or adjusted under 35 U.S.C. 154(b) by 19 days.

(21) Appl. No.: 13/062,879

(22) PCT Filed: Aug. 26, 2009

(86) PCT No.: PCT/GB2009/051061
§ 371 (c)(1),
(2), (4) Date: Mar. 8, 2011

(87) PCT Pub. No.: WO2010/029329
PCT Pub. Date: Mar. 18, 2010

(65) Prior Publication Data
US 2011/0159268 A1  Jun. 30, 2011

(30) Foreign Application Priority Data

Sep. 10, 2008 (GB) ................... 0816543.3
Apr. 2, 2009 (GB) ................... 0905785.2

(51) Int. Cl.
*C09D 11/00* (2006.01)

(52) U.S. Cl. .................. 106/31.32; 106/31.64
(58) Field of Classification Search ............. 106/31.32, 106/31.64
See application file for complete search history.

(56) References Cited

U.S. PATENT DOCUMENTS

| 5,095,134 A | 3/1992 | Liu |
| 2003/0103905 A1 | 6/2003 | Ribi |
| 2005/0231585 A1* | 10/2005 | Mudigonda et al. .......... 347/238 |
| 2007/0277700 A1* | 12/2007 | Wagenblast et al. ....... 106/31.45 |
| 2010/0068234 A1* | 3/2010 | Jarvis ............................ 424/400 |

FOREIGN PATENT DOCUMENTS

| WO | WO 92/07298 | 4/1992 |
| WO | WO 2005068207 A1 * | 7/2005 |
| WO | WO 2006/018640 | 2/2006 |

OTHER PUBLICATIONS

Database WPI Week 200622, Accession No. 2006-207542, XP-002554424, corresponding to Japanese Publication No. JP 2006-063045, published Mar. 9, 2006.

* cited by examiner

*Primary Examiner* — Veronica F. Faison
(74) *Attorney, Agent, or Firm* — Saliwanchik, Lloyd & Eisenschenk

(57) ABSTRACT

A composition susceptible to changing color upon the application of energy, wherein the composition comprises a color former and a tinting colorant, wherein the tinting colorant has a complementary color to that of the composition comprising the color former without tinting colorant. Preferably, the composition 5 also comprises an energy absorbing additive. The invention also provides a method of improving contrast when a composition susceptible to changing color is imaged.

20 Claims, No Drawings

ENERGY ACTIVATED COMPOSITIONS

CROSS REFERENCE TO A RELATED APPLICATION

This application is a National Stage Application of International Application Number PCT/GB2009/051061, filed Aug. 26, 2009; which claims priority to Great Britain Application No. 0816543.3, filed Sep. 10, 2008; and Great Britain Application No. 0905785.2, filed Apr. 2, 2009; all of which are incorporated herein by reference in their entirety.

FIELD OF THE INVENTION

The present invention relates to compositions comprising a colour former, an energy absorbing additive and a tinting colourant, and methods for improving the contrast of images formed from compositions comprising colour formers and energy absorbing additives.

BACKGROUND TO THE INVENTION

Many systems are known that comprise agents that are activated by, or respond to, light. There are generally two mechanisms of action. The agent may itself directly absorb incident light and in doing so bring about the desired response or activation. Alternatively, the agent does not directly absorb the incident light, but a light-absorbing additive is present to initiate the response or activation.

An example of the first mechanism is laser imaging with the colour change agent ammonium octamolybdate (AOM) using a $CO_2$ laser that emits radiation in the mid-infrared region of the spectrum at approximately 10.6 microns. AOM is particularly useful for laser imaging using a $CO_2$ laser, absorbing 10.6 micron radiation and undergoing a white to black colour change reaction. As a result AOM has negligible absorbance in the visible region of the spectrum (400 to 700 nm). Consequently ink formulations that comprise AOM appear white. As AOM changes into black, aesthetically pleasing printed substrates are obtained together with a high level of contrast which is required for machine readability such as with barcodes.

AOM can also be used to exemplify the second mechanism. AOM has negligible absorbance in the near infrared (NIR) region of the spectrum (780 to 2500 nm). However, there are applications where it would be desirable to employ a smaller NIR fibre laser (rather than a bulky $CO_2$ laser). Therefore, to image AOM based ink formulations with a NIR fibre laser, operating for example with an emission wavelength of 1070 nm, a NIR absorbing component has to be included in the system. Examples of the sort of NIR absorbing compounds that have been used to do this are inorganic pigments such copper (II) hydroxyl phosphate (CHP), organic NIR dyes such as N,N,N',N'-tetrakis(4-dibutylaminophenyl)-p-benzoquinone bis(iminium hexafluoroantimonate) (ADS-1065) and Lumogen IR-1050, and conductive polymers such as PEDOT (sold as Baytron P).

However, because NIR absorbers have absorbance maximum peaks in the NIR region there is usually a tailing of this peak into the visible region of the spectrum. Consequently, most NIR absorbers appear visibly coloured and thus substrates that comprise NIR absorbers also appear visibly coloured. The depth of colour depends on the concentration of NIR absorbing additive used. In the case of inks, substrates coated with formulations that comprise NIR absorbers can appear visibly coloured rather than white. One of the main advantages of AOM is the fact that it is colourless and substrates coated with AOM based inks for use in $CO_2$ laser imaging appear white. However, substrates coated with inks comprising AOM and a NIR absorber, for use in NIR fibre laser imaging, appear coloured. The effect is particularly noticeable with white substrates such as plastic film and paper. This is not only unappealing to the eye but can hinder machine code readability.

SUMMARY OF THE INVENTION

A first aspect of the invention is a composition susceptible to changing colour when energy is applied, wherein the composition comprises a colour former and a tinting colourant, wherein the tinting colourant has a complementary colour to the colour of the composition comprising the colour former without tinting colourant.

A further aspect of the invention is a method of improving contrast when a composition susceptible to changing colour when energy applied is imaged, wherein the composition comprises a colour former and optionally an energy absorbing additive, comprising adding to the composition a tinting colourant which has a colour complementary to the colour of the composition comprising colour former and energy absorbing additive, if present, without the tinting colourant. The composition in this method has the preferred features as described in relation to the first aspect of this invention.

In this invention, the tinting colourant advantageously counteracts the colouring effect of the colour former or energy absorbing additive. Most typically, the energy absorbing additive is coloured, and the invention allows the composition to be used in circumstances wherein high contrast between the background and image is required. The method may alternatively be referred to as "dampening" the colour of the composition.

DETAILED DESCRIPTION OF THE INVENTION

The compositions of the present invention can be surface coating formulations such as inks or paints. Substrates coated with such formulations such as plastic films, metal cans, foils and papers also form part of the invention. The compositions can also be incorporated into the body of such substrates—for instance, within the body of moulded plastics, plastic films, textiles and papers.

The energy activated colour formers suitable for use in the present invention include diacetylenes, charge transfer agents, leuco dyes, photochromics, metal oxyanions such as molybdates and borates, dehydration agents, charrables and the like. Suitable examples of these chemistries are taught in WO2006129086 A1, WO2007045912 A1, WO2002068205 A1, WO2006129078 A1, WO2004043704 A1, WO2002074548 A3, WO2006018640 A1, WO2007063339 A3 and WO2006051309 A1, WO2009081385.

Other colour change chemistries suitable for use in the present invention are taught in WO2009003976, WO2002006058, U.S. Pat. No. 6,903,153, WO2007114829, WO2006063165, US20070098900 WO2008083912 and WO2008107345.

Particularly preferred colour formers are metal oxyanions, diacetylenes, charge transfer agents and leuco dyes. Charge transfer agents and leuco dyes are particularly preferred when used in combination with a photoacid generating agent. The most preferred colour formers are diacetylenes. Preferred colour formers are those that are colourless when un-activated but become visually coloured on activation. Ammonium octamolybdate and sodium metaborate are examples of particularly preferred metal oxyanion colour formers. Sodium metaborate is particularly preferred when used in combination with a charrable such as a carbohydrate or sugar.

Diacetylene compounds are substances which include at least one diacetylene group, i.e. —C≡C—C≡C—. Particularly preferred are diacetylene compounds that exhibit a polychromic colour change reaction. These compounds are initially colourless but on exposure to suitable light, such as a ultra-violet light, undergo a colour change reaction to produce a blue colour. Certain diacetylenes in their blue form can then be exposed to further light such as near-infrared light, which converts the blue form into a magenta, red, yellow and green form.

Specific examples of diacetylene compounds may be used in the present invention are given in the published patent application number WO2006/018640.

Further examples include those represented by the following general structures:

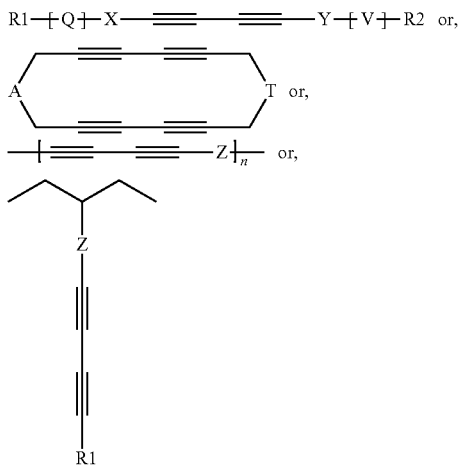

wherein,

X and Y are divalent straight-chain or branched alkylene type groups (—CH$_2$—)$_n$ wherein n=0 to 24, or a divalent phenylene type group (—C$_6$H$_4$—)$_n$ wherein n=0 to 1 or a combination of both types;

Q and V, if present, are divalent bridging groups such as —S—, —O—, —NHR'— wherein R' is hydrogen or alkyl, amide, ester or thioester groups, carbonyl or carbamate;

R1 and R2 are H or alkyl;

A and T are divalent groups that can either be an alkylene or phenylene type such as X or Y, or a bridging type such as Q or V, or a combination of both types, X or Y that additionally comprises a Q or V group;

Z is a divalent group such as X or Q or a combination of both, X that additionally comprises a Q group, or Z can be not present, and n is 2 to 20,000,000.

Groups X and Y are optionally substituted, preferably at the α, β or γ position with respect to the diacetylene group. For instance, there may be an α-hydroxy group, as shown in the formula below:

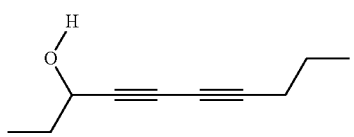

The diacetylene may be symmetrical or non-symmetrical.

Q and V are optionally substituted with groups such as amine, alcohol, thiol or carboxylic acid. Both Q and V may be present, or alternatively, just Q.

Where R1 and R2 in the above compounds are alkyl, they may be straight or branched chain and may additionally comprise other functional groups known in organic chemistry such as alcohol, amine, carboxylic acid, aromatic ring systems and unsaturated groups such as alkenes and alkynes.

Groups R1, R2, Q, V, X and Y may comprise ionic groups, which can be anionic or cationic. Examples include sulphate groups (—SO$_3$—) and ammonium groups. The ionic groups can have any suitable counterion.

Further diacetylene compound examples are diacetylene carboxylic acids and derivatives thereof. A particularly preferred diacetylene carboxylic acid compounds are 10,12-pentacosadiynoic acid and 10,12-docosadiyndioic acid and their derivatives thereof. Further examples include: 5,7-dodecadiyndioic acid, 4,6-dodecadiynoic acid, 5,7-eicosadiynoic acid, 6,8-heneicosadiynoic acid, 8,10-heneicosadiynoic acid, 10,12-heneicosadiynoic acid, 10,12-heptacosadiynoic acid, 12,14-heptacosadiynoic acid, 2,4-heptadecadiynoic acid, 4,6-heptadecadiynoic acid, 5,7-hexadecadiynoic acid, 6,8-nonadecadiynoic acid, 5,7-octadecadiynoic acid, 10,12-octadecadiynoic acid, 12,14-pentacosadiynoic acid, 2,4-pentadecadiynoic acid, 5,7-tetradecadiynoic acid, 10,12-tricosadiynoic acid 2,4-tricosadiynoic acid, and derivatives thereof. Diacetylene alcohols and diol compounds and derivatives thereof are also preferred, examples include: 5,7-dodecadiyn-1,12-diol, 5,7-eicosadiyn-1-ol, 2,4-heptadecadiyn-1-ol, 2,4-hexadiyn-1,6-diol, 3,5-octadiyn-1,8-diol, 4,6-decadiyn-1,10-diol, 2,7-dimethyl-3,5-octadiyn-2,7-diol, 14-hydroxy-10,12-tetradecadiynoic acid. Others include 1,6-diphenoxy-2,4-hexadiyne, 1,4-diphenylbutadiyne, 1,3-heptadiyne, 1,3-hexadiyne and 2,4-hexadiyne.

A combination of different diacetylenes can also be employed. A particularly preferred combination is that of 10,12-pentacosadiynoic acid or 10,12-docosadiyndioiac acid and derivatives thereof and 2,4-hexadiyn-1,6-diol. 10,12-pentacosadiynoic acid can produce blue, red and yellow. 2,4-hexadiyn-1,6-diol can produce a cyan colour. Activating 10,12-pentacosadiynoic acid to yellow and 2,4-hexadiyn-1, 6-diol to cyan simultaneously gives rise to green.

A diacetylene compound that is 'activatable', i.e. has a first solid form that is relatively unreactive to light, but upon 'activation' is transformed into a second form that is relatively reactive to light and is thus capable of undergoing a colour change reaction to create a visible image, has particular utility in the present invention. Without being limited by theory the activation could be a re-crystallisation, crystal form modification, co-crystal combination or a melting/re-solidification process.

Reversibly activatable diacetylenes that can flip between unactivated and activated forms in response to a stimulus or removal of a stimulus also form part of the present invention.

Particularly preferred diacetylenes are those that after initial melting and re-solidification activation are colourless but become blue on exposure to light, particularly UV light. The most preferred diacetylenes compounds are carboxylic acids and derivatives thereof where:

either R and/or R' comprises a COX group,
where X is: —NHY, —OY, —SY, where Y is H or any group comprising at least one carbon atom.

Particularly preferred still are derivatives in which the carboxylic acid group has been functionalised into an amide, ester or thioester. These can be easily made by reacting a diacetylene carboxylic acid with a chlorinating agent such as oxalyl chloride and then reacting the diacetylene acid chloride with a nucleophilic compound such as an amine, alcohol or thiol. A particularly preferred diacetylene carboxylic acid compound is 10,12-docosadiyndioic acid and derivatives thereof such as amides, esters, thioesters and the like. Especially particularly preferred 10,12-docosadiyndioic acid derivatives are amides. A particularly preferred still 10,12-docosadiyndioic acid amide derivative is the propargylamide in which at least one, preferably both carboxylic acid groups have been transformed into the propargylamide, as shown below:

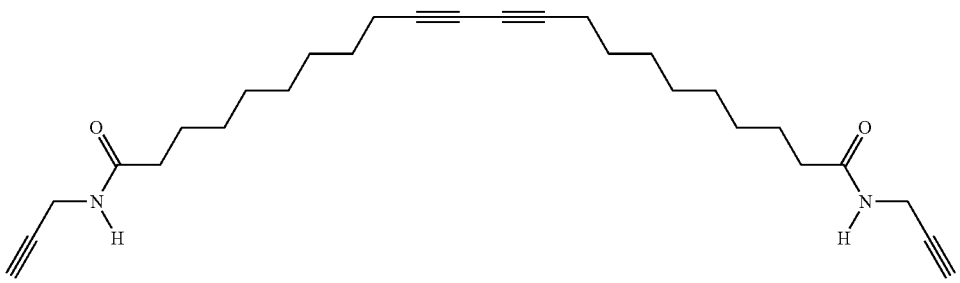 [SMILES: C#CCNC(=O)CCCCCCCCC#CC#CCCCCCCCCC(=O)NCC#C]

Propargylamides are made by reacting carboxylic acids with propargylamine.

Other preferred amines that can be used to create suitable amides include: dipropargylamine and 1,1-dimethylpropargylamine.

The activatable diacetylene is generally used together with a NIR light absorbing agent, which is a compound that absorbs light in the wavelength range 700 to 2500 nm.

A NIR light source, such as a NIR fibre laser, is used to heat the composition only in the areas where the image is required. A UV light source, such as a germicidal lamp, is then used to flood the composition with UV light. However, the diacetylene compound only undergoes a colour change reaction to create an image in the areas which were initially exposed to NIR light. The areas of the coating unexposed to NIR light undergo a negligible colour change reaction, remain essentially colourless, and are stable to background radiation. A thermal print head may be used to initiate the heat-based pre-activation step.

Specific examples of NIR light absorbing agents include:
i. Organic NIR absorbing agents
ii. NIR absorbing 'conductive' polymers
iii. Inorganic NIR absorbing agents
iv. Non-stoichiometric inorganic absorbing agents.

Particularly preferred NIR absorbing agents are those that have essentially no absorbance in the visible region of the spectrum (400 to 700 nm) and thus give rise to coatings that appear visibly colourless.

Organic NIR absorbing agents are known as NIR dyes/pigments. Examples include but are not limited to: families of metallo-porphyrins, metallo-thiolenes and polythiolenes, metallo-phthalocyanines, aza-variants of these, annellated variants of these, pyrylium salts, squaryliums, croconiums, amminiums, diimoniums, cyanines and indolenine cyanines.

Examples of organic compounds that can be used in the present invention are taught in U.S. Pat. No. 6,911,262, and are given in Developments in the Chemistry and Technology of Organic dyes, J Griffiths (ed), Oxford: Blackwell Scientific, 1984, and Infrared Absorbing Dyes, M Matsuoka (ed), New York: Plenum Press, 1990. Further examples of the NIR dyes or pigments of the present invention can be found in the Epolight™ series supplied by Epolin, Newark, N.J., USA; the ADS series supplied by American Dye Source Inc, Quebec, Canada; the SDA and SDB series supplied by HW Sands, Jupiter, Fla., USA; the Lumogen™ series supplied by BASF, Germany, particularly Lumogen™ IR765 and IR788; and the Pro-Jet™ series of dyes supplied by FujiFilm Imaging Colorants, Blackley, Manchester, UK, particularly Pro-Jet™ 830NP, 900NP, 825LDI and 830LDI. Further examples are taught in WO08/050,153.

Examples of NIR absorbing 'conductive' polymers include PEDOT such as, the product Baytron® P supplied by HC Starck. Further examples are taught in WO05/12442.

Examples of inorganic NIR absorbing agents include copper (II) salts. Copper (II) hydroxyl phosphate (CHP) is particularly preferred. Further examples are taught in WO05/068207.

Examples of non-stoichiometric inorganic absorbing agents include reduced indium tin oxide, reduced antimony tin oxide, reduced titanium nitrate and reduced zinc oxide. Further examples are taught in WO05/095516. Reduced indium tin oxide is particularly preferred in combination with a 1550 nm to 2500 nm laser.

It is particularly preferred if the absorption profile of the NIR absorbing agent approximately matches the emission wavelength(s) of the NIR light source employed.

Other light absorbing agents that can be used, instead of the NIR absorbing agent include UV (200 to 400 nm), visible (400 to 700 nm) and mid-infrared (~10.6 microns) light absorbing agents. Examples includes dyes/pigments, UV absorbers and Iriodin type agents.

Charge transfer agents may be used together with a diacetylene in the present invention. These are substances that are initially colourless but react with protons ($H^+$) to produce a coloured form. Charge transfer agents that form part of the present invention include compounds known as carbazoles and suitable examples are described in WO2006/051309. Further charge transfer agents known to those skilled in the art such as leuco dyes can also be used. Charge transfer agents are usually used in combination with other substances such as light absorbing agents which can be wavelength specific, heat generating agents, acid generating agents and the like.

A particularly preferred combination for use in this invention is a diacetylene such as 10,12-pentacosaidiynoic acid, or 10,12-docosadiyndioic acid (or a derivative thereof), to give blue and red, with a charge transfer agent that generates green.

Leuco dyes are colourants that change colour on response to a change in environment. Typically leuco dyes are colourless within an alkaline or neutral environment but become coloured within an acidic environment. Suitable leuco dyes are described in "Dyestuffs and Chemicals for Carbonless Copy Paper" presented at Coating Conference (1983, San Francisco, Calif. pp 157-165) by Dyestuffs and Chemicals Division of Ciba-Geigy Corp Greenboro, N.C. Leuco dyes are understood to be colourless in neutral or alkaline media, but become coloured when they react with an acidic or electron accepting substance. Suitable examples include compounds such as triphenylmethanephthalide compounds, azaphthalide compounds, isoindolide phthalide compounds, vinylphthalide compounds, spiropyran compounds, rhodamine lactam compounds, lactone and dilactone compounds, benzoyl leuco methylene blue (BLMB), derivatives of bis-(p-di-alkylaminoaryl)methane, xanthenes, indolyls, auramines, chromenoindol compounds, pyrollo-pyrrole compounds, fluorene compounds, and fluoran and bisfluoran compounds, with fluoran compounds being preferred. Particularly preferred commercial leuco dye products include the Pergascript range by Ciba Speciality Chemicals, Basel, Switzerland and those by Yamada Chemical Co. Ltd, Kyoto, Japan. Others include those made by Nisso Chemical Co GmbH a subsidiary of Nippon Soda Co. Ltd. Tokyo, Japan.

Charge transfer agents and leuco dyes are usually used in combination with an acid generating agent, particularly a photoacid generating agent. Examples of suitable compound include 'onium' types such as sulphonium and iodonium compounds.

Charrable agents may optionally be included in the compositions of the invention. These are agents that will char or undergo a caramelisation reaction to yield a contrasting mark. Examples include carbohydrates, polysaccharides, sugars, gums, starches and the like. Further examples include: glucose, sucrose, saccharose, polydextrose, maltodextrin (of any DE), locust bean gum, guar gum, starch, reducing carbohydrates, alginates and the like. It is preferred that the charrable agent is used in combination with a base such as sodium bicarbonate. It is particularly preferred that sodium metaborate is used in combination with a charrable agent.

Other colour change chemistries suitable for use in the present invention are taught in WO2008/083912, WO2008/107345, WO2009/003976, WO2002/006058, U.S. Pat. No. 6,903,153, WO2007/114829, WO2006/063165, US20070098900.

The present invention is also suitable for use in the co-pending PCT Application to the same Applicant claiming priority from GB0816530.0.

Preferred colour formers are those that are colourless or white prior to imaging. Particularly preferred colour formers are leuco dyes, diacetylenes and metal oxyanions. More particularly preferred still colour formers are diacetylenes and metal oxyanions, such as molybdates in particular octamolybdates such as ammonium octamolybdate (AOM), which is the most preferred, and also borates, in particular metaborates such as sodium metaborate. As detailed above, ink formulations comprising AOM, sodium metaborate, leuco dyes and diacetylenes usually appear essentially white or colourless, prior to imaging.

The present invention also includes the use colour formers that are intrinsically coloured. Here the tinting agent can be used to tint away the background colour caused by the intrinsically coloured colour former, or a background colour formed by a mixture of the intrinsically coloured colour former and energy absorbing additive.

The present invention also includes the use of intrinsically coloured colour formers as tinting agents for the energy absorbing agent. Here the intrinsically coloured colour former has a colour complementary to that of the energy absorbing additive and the combination of the two produce a neutral background colour.

The energy absorber additive is typically a near infrared absorber. Preferred examples have an absorption maximum in the region 700 to 2500 nm. Alternatively, it may absorb UV, visible or mid-infrared light such as that emitted from a $CO_2$ laser. Suitable examples of near-infrared absorbers include: copper (II) salts such as copper (II) hydroxylphosphate (CHP); mixed metal oxides such as indium tin oxide (ITO), antimony tin oxide (ATO), particularly non-stoichiometric versions such as reduced-ITO and reduced-ATO and coated micas thereof and non-stoichiometric zinc oxide; conductive polymers such as PEDOT sold as Baytron P (ex. HC Starck) and organic dye/pigment type near infrared absorbers such as N,N,N',N'-tetrakis(4-dibutylaminophenyl)-p-benzoquinone bis(iminium hexafluoroantimonate). NIR dyes/pigments than can be used include metallo-porphyrins, metallo-thiolenes and polythiolenes, metallo-phthalocyanines, aza-variants of these, annellated variants of these, pyrylium salts, squaryliums, croconiums, amminiums, diimoniums, cyanines and indolenine cyanines. Examples of organic compounds that can be used in the present invention are taught in U.S. Pat. No. 6,911,262, and are given in Developments in the Chemistry and Technology of Organic dyes, J Griffiths (ed), Oxford: Blackwell Scientific, 1984, and Infrared Absorbing Dyes, M Matsuoka (ed), New York: Plenum Press, 1990. Further examples of the NIR dyes or pigments of the present invention can be found in the Epolight™ series supplied by Epolin, Newark, N.J., USA; the ADS series supplied by American Dye Source Inc, Quebec, Canada; the SDA and SDB series supplied by HW Sands, Jupiter, Fla., USA; the Lumogen™ series supplied by BASF, Germany, particularly Lumogen™ IR765, IR788 and IR1055; and the Pro-Jet™ series of dyes supplied by FujiFilm Imaging Colorants, Blackley, Manchester, UK, particularly Pro-Jet™ 830NP, 900NP, 825LDI and 830LDI. Most preferably the near-infrared absorber is copper (II) hydroxide phosphate (Fabulase 322, ex. Budenheim).

By way of example only, indicated below are the background colours of a white PET film coated with AOM-based inks that additionally comprise the following NIR absorbers:

| | |
|---|---|
| AOM only, no NIR absorber | White |
| AOM + CHP | Lime Green |
| AOM + ADS-1065 | Beige brown |
| AOM + Lumogen IR-1050 | Olive green |
| AOM + Baytron P | Navy blue |

It has been found however, that if a small quantity of a colourant with a colour complimentary to the visible colour of the NIR absorber (hereinafter referred to as "tinting colourant") is also included in the composition, the colour of the overall composition can appear a neutral grey. The human eye is particularly sensitive to changes in shade but less so to the changes in contrast and lightness, i.e. in terms of polar CIELAB coordinates, changes in lightness ($L^*$) and chroma (C) are much less noticeable to the average observer than changes in hue angle ($h°$). Therefore the average observer will notice the colour of an article that is neutral grey much less than one which appears red, green, blue, yellow, cyan, magenta in colour for a given lightness and chroma. This is especially the case with very pale, almost white colours. The colour of a pale neutral grey article such as a printed substrate is much less noticeable than one which has a distinct hue. The effect is particularly noticeable where the substrate is white such as a plastic film or paper. Yellow-green colours are particularly noticeable as human colour vision is most responsive to yellow-green light under normal illumination.

The following table indicates colours which are complimentary to each other and when mixed give rise to a neutral grey. The effect is known as dampening, as it dampens or reduces the visible colour of the composition:

| Colour of composition without tinting colourant | Colour of Suitable Tinting Colourant |
|---|---|
| Yellow | Violet/purple |
| Yellow green | Red violet/purple |
| Green | Red |
| Blue green | Red orange |
| Blue | Orange |
| Blue violet/purple | Yellow orange |

If the unimaged colour former is itself coloured then the tinting colourant should have a colour complimentary to the combined colour of the colour former and energy absorbing additive.

Suitable tinting colourants include dyes and pigments known from the dyeing and printing, textile, paper, food, cosmetics and plastics coloration industries. As shown in the table above, the colour of the tinting colourant should be selected to complement the colour of the NIR absorber. Violet colourants, typically absorbing light in the region 520 nm to 620 nm and reflecting light in region 380 nm to 450 nm region of the visible spectrum, have been found to be particularly useful in dampening the characteristic yellow-green colour obtained by the inclusion of the NIR absorbing agent copper (II) hydroxide phosphate into an ink formulation or substrate, particularly CI Pigment Violets 3, 3:1, 3:4, 19, 23 and 27. CI Pigment Violet 23 is particularly preferred. Suitable examples of these and others are supplied by companies including: EC Pigments, Stockport UK, Thomas Swan, Consett UK and Ciba, Basel, Switzerland. Indeed, the present invention is particularly suitable for using with any NIR imageable formulation that employs CHP as the NIR absorbing agent.

Typical application levels of the tinting colourant required for colour damping depend upon the concentration of colour present in the article. Typical values are in the range 0.0001 to 1%, preferably still 0.001 to 0.1%, more preferably still 0.0025 to 0.025% by weight.

Surprisingly, in the case of ink formulations, when the neutral grey ink is coated onto white PET film at a coat white required for laser imageability the coated substrate appears to have no noticeable overall colouration, particularly when the coated substrate is in isolation or placed again a coloured background.

The invention can also be applied to plastic articles where light absorbers are employed. Examples include laser weld where the plastic comprises a light absorbing additive, usually a NIR dye that is visibly coloured. A further application is light curing.

The composition of the present invention can be imaged to write text, characters, logos, trademarks, devices and other brand identification patterns onto a water-soluble capsule. The method may involve imaging with a laser, which may be controlled by an IBM compatible computer. Imaging may alternatively be performed using a non-coherent energy source through a mask. Using non-contact energy to print images onto capsules prevents contact damage to the capsule which can occur with traditional printing processes.

Suitable lasers for use in image generation include UV, visible, NIR and $CO_2$ lasers.

The skilled person can select a colour former, or combination of colour formers, according to the eventual colours required. The marking laser intensity, wavelength and/or time of exposure can all be varied to ensure that an appropriate colour is produced. WO2006/114594 describes an apparatus which includes a laser diode and galvanometer, and is suitable for aligning the laser beam onto the colour forming composition in the present invention. WO2007/039715 furthermore describes a method of inkless printing. As in these publications, the colour of the colour-forming composition in this invention is selectable according to the fluence level of the irradiation at a desired point.

The colour former may be included in the film in the form of a laser-imageable composition, which comprises the colour former and a binder.

Further additives may include: dispersing agents, acid/base-generators, UV absorbers/stabilizers, processing aids, cosolvents, whitening agents, foam suppressants etc.

The colour former utilised in this invention comprises any substance or combination of substances which change appearance or absorption profile when irradiated with light. The term light encompasses all forms of radiative energy such as electron beams. The light energy can be UV, visible, near-infrared or mid-infrared. The light energy can have a wavelength in the region 120 nm to 20 microns. The light can be monochromatic or broadband. The light can be laser light or non-coherent light. The laser light can be continuous wave or pulsed.

Lasers are particularly preferred as they give high definition images, essential for machine readable codes. The laser can be a UV, visible, NIR, or $CO_2$ laser, an excimer, a Nd:YAG, a solid state, a diode or diode array laser.

The colour former can be included within the article (such as a moulded plastic article made using a masterbatch technique), or added to the article (for instance, paper) during manufacture, or applied directly to the article such as via a spray, or applied to the article as part of a coating application using a printing technique.

The article can be any substrate, such as glass, film, paper including board, card, carton and corrugate, plastics including 3-dimentional articles and films, wood, textiles, metals including cans and foils, foodstuffs, pharmaceuticals or any substance that the colour former/tinting agent can be incorporated into.

The colour former/tinting agent can also be formulated into an ink, paint or lacquer, and then applied to the substrate using any suitable technique. Particularly preferred substrates are those used by the printing industry such as paper (including card, carton and corrugate of any colour) and plastic films such as PET and BOPP, both clear and white versions. The invention is particularly suitable with colourless or white articles/substrates as these are most susceptible to changes in appearance by the inclusion of coloured materials. Also preferred are substrates that can be used to make banknotes, the outer shell of pharmaceutical tablets, excise stamps, ID and high value documents such as passports and driving licenses, and the packaging of consumer goods.

The invention will now be illustrated by the following Examples.

EXAMPLES

In these Examples CIELAB data was obtained using a GregtagMacBeth SpectroEye handheld flectance spectrophotometer. L* refers to Lightness, a* to redness-greeness and b* to yellowness-blueness.

1. LDPE plaques were produced as follows:
   a. With AOM 5% and Lumogen IR-1050 (0.05%)
   b. With AOM 5%, Lumogen IR-1050 (0.05%) and Eljon Red NRO (ex. EC Pigments, CI Pigment Red 170, 0.001%).

The plaque with just AOM and Lumogen IR-1050 appeared olive green, the plaque with AOM, Lumogen IR-1050 and Eljon Red NRO appeared a neutral grey.

2. An aqueous ink formulation based on AOM and CHP was produced as follows:

| | |
|---|---|
| AOM | 350 g |
| CHP | 200 g |
| Paranol T6320 | 300 g |
| Glascol LS2 | 125 g |
| Dispelair CF49 | 25 g |

The formulation was Silverson mixed until a particle size of less than 5 microns was obtained.

The following base ink was made with CI Pigment Violet 23:

| | |
|---|---|
| Glascol LS2 | 96.5 g |
| Dispelair CF49 | 2.5 g |
| Casacolour Violet 230 (ex. Thomas Swan) | 1 g |

The ink was milled for 15 minutes using a 50 ml Eiger-Torrance bead mill.

The AOM/CHP ink was split into two equal portions and the violet base ink added to one portion to give a violet pigment concentration of 0.0125%. The AOM/CHP ink without violet pigment appeared yellow-green, the AOM/CHP ink with violet pigment appeared neutral grey.

The inks were drawn down onto white 50 micron PET film at 5 gsm using a K-3 bar and RK-Proofer Printer. The inks were also applied to white lined corrugate using an Anilox roller applicator.

The drawdowns without violet dye appeared lime green, the ink with violet pigment appear neutral grey, essentially colourless when placed in isolation. Laser imaging was unaffected by the presence of the violet pigment.

The following PET film CIELAB data was generated:

| | L* | a* | b* |
|---|---|---|---|
| AOM/CHP ink | 96.65 | −1.25 | 1.00 |
| Tinted with violet | 95.27 | 0.03 | −1.05 |

The data shows that the addition of violet tinted the CHP/AOM ink from a green-yellow to a more aesthetically pleasing neutral blue-grey, as seen by the increase in a* to give a value that is almost 0 (to give a neutral colour neither red nor green) and the decrease in b* going from yellow to blue.

3. An non-aqueous CHP/AOM ink formulation was prepared as followed:

An aqueous ink formulation based on AOM and CHP was produced as follows:

| | |
|---|---|
| AOM | 300 g |
| CHP | 200 g |
| Elvacite 2028 15% in ethanol/ethyl acetate | 500 g |
| Mill half without any pigment and half with Casacolour Violet 230 | 25 mg |

The above formulations were each milled using a 50 ml Eiger-Torrance bead mill for 15 minutes.

The formulations were drawn down on to white PET film to give a coat weight of about 4 gsm. The formulation comprising the violet pigment appeared neutral grey/virtually colourless, whereas the formulation without the violet pigment appeared noticeably yellow-green.

4. An ink formulation based on a leuco dye colour former and CHP was produced as follows:

| | |
|---|---|
| Yamada ETAC | 50 g |
| CHP | 200 g |
| Paranol T6320 | 500 g |
| Glascol LS2 | 225 g |
| Dispelair CF49 | 25 g |

The ink was milled for 5 passes using a 50 ml Eiger-Torrance bead mill.

The same violet base ink was used as formulated in Example 2.

The leuco dye/CHP ink was split into two equal portions and the violet base ink added to one portion to give a pigment concentration of 0.0125%. The leuco dye/CHP ink without violet pigment appeared green, the leuco dye/CHP ink with violet pigment appeared neutral grey.

The inks were drawn down onto white 50 micron PET film at 5 gsm using a K-3 bar and RK-Proofer Printer. The inks were also applied to white lined corrugate using an Anilox roller applicator.

The drawdowns without violet dye appeared lime green, the ink with violet pigment appear neutral grey, and essentially colourless when placed in isolation. Laser imaging was unaffected.

The drawdown without violet dye appeared lime green, the ink with violet pigment appear neutral grey, and essentially colourless when placed in isolation. Laser imaging was unaffected.

The following PET film CIELAB data was generated:

| | L* | a* | b* |
|---|---|---|---|
| Leuco dye/CHP ink | 95.35 | −1.82 | 1.64 |
| Tinted with violet | 94.72 | 0.06 | −0.88 |

The invention claimed is:

1. A composition susceptible to changing colour when energy is applied, wherein the composition comprises a colour former and a colour damping agent, wherein the colour damping agent has a complementary colour to that of the composition comprising the colour former without the colour damping agent, wherein the composition is configured to provide a neutral background color after the composition is imaged.

2. The composition according to claim 1, which further comprises an energy absorbing additive, and the colour damping agent has a complementary colour to the composition comprising the colour former and energy absorbing additive without the colour damping agent.

3. The composition according to claim 1, which is an ink formulation.

4. The composition according to claim 1, wherein the colour former is a metal oxyanion, leuco dye, charge transfer agent or diacetylene.

5. The composition according to claim 4, wherein the metal oxyanion is ammonium octamolybdate or sodium metaborate.

6. The composition according to claim 1, wherein the energy is provided by a laser source.

7. The composition according to claim 2, wherein the energy absorbing additive absorbs energy in the region 700 to 2500 nm.

8. The composition according to claim 7, wherein the energy absorbing additive is a copper(II) salt, a reduced metal or mixed metal oxide, conductive polymer or an NIR dye/pigment.

9. The composition according to claim 1, further comprising an energy absorbing additive, wherein the energy absorbing additive is copper (II) hydroxide phosphate and is used in combination with a colour damping agent that is a violet dye or pigment.

10. The composition according to claim 2, wherein both the energy absorbing additive and the colour former are capable of absorbing energy.

11. The composition according to claim 1, wherein the colour former is intrinsically coloured.

12. The composition according to claim 1, wherein the colour damping agent is present at a concentration of 0.0001 to 1% by weight of the composition.

13. A substrate comprising a composition according to claim 1, wherein the substrate is a plastic article or film, textile or paper product.

14. The substrate according to claim 13, wherein the composition is coated on to the substrate.

15. The substrate according to claim 13, wherein the substrate is initially white or colourless.

16. A method of improving contrast when a composition susceptible to changing colour when energy is applied, is imaged, wherein the composition comprises a colour former and optionally an energy absorbing additive, wherein the method comprises adding to the composition a colour damping agent which has a colour complementary to that of the composition comprising colour former and energy absorbing additive, if present, without the colour damping agent, wherein a neutral background colour is achieved after the composition is imaged.

17. An article comprising a composition according to claim 1, that can be imaged using a laser.

18. The composition, according to claim 6, wherein the laser source has an emission wavelength in the region 120 nm to 20 microns.

19. The composition, according to claim 8, wherein the energy absorbing additive is copper (II) hydroxide phosphate.

20. The method according to claim 16, wherein the colour damping agent is present at a concentration of 0.0001 to 1% by weight of the composition.

* * * * *